United States Patent
Ozawa et al.

(10) Patent No.: US 10,126,395 B2
(45) Date of Patent: Nov. 13, 2018

(54) MAGNETIC RESONANCE IMAGING APPARATUS AND MAGNETIC RESONANCE IMAGING METHOD

(71) Applicant: TOSHIBA MEDICAL SYSTEMS CORPORATION, Otawara-shi, Tochigi (JP)

(72) Inventors: Shinya Ozawa, Tochigi (JP); Kazuya Tanoue, Tochigi (JP); Naoyuki Takabayashi, Tochigi (JP); Yoshimori Kassai, Tochigi (JP); Yukihiko Tomoda, Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1000 days.

(21) Appl. No.: 14/566,939

(22) Filed: Dec. 11, 2014

(65) Prior Publication Data
US 2015/0168521 A1  Jun. 18, 2015

(30) Foreign Application Priority Data

Dec. 17, 2013 (JP) ................................ 2013-260701
Jun. 4, 2014 (JP) ................................ 2014-116132

(51) Int. Cl.
G01R 33/54 (2006.01)
G01R 33/48 (2006.01)
G01R 33/50 (2006.01)

(52) U.S. Cl.
CPC ........ *G01R 33/543* (2013.01); *G01R 33/4828* (2013.01); *G01R 33/50* (2013.01)

(58) Field of Classification Search
CPC ... G01R 33/50; G01R 33/543; G01R 33/4828
See application file for complete search history.

(56) References Cited

U.S. PATENT DOCUMENTS 5,477,575 A * 12/1995 Lehne .................. A61B 5/0555
                                                              5/511
7,068,032 B2    6/2006 Agilandam et al.
(Continued)

FOREIGN PATENT DOCUMENTS

JP    1-221153    9/1989
JP    H03-205031  9/1991
(Continued)

OTHER PUBLICATIONS

First Japanese office action dated Sep. 4, 2018, in Patent Application No. JP 2014-228500.

*Primary Examiner* — Dixomara Vargas
(74) *Attorney, Agent, or Firm* — Nixon & Vanderhye P.C.

(57) ABSTRACT

An MRI apparatus includes a reception gain storage part, a reception gain acquisition part, and a generation part. The reception gain storage part is configured to store reception gains of MR signals. The reception gains are related to at least one of pieces of patient information and imaging conditions. The reception gain acquisition part is configured to obtain a corresponding reception gain from the reception gain storage part, based on at least one of a piece of patient information and an imaging condition of an object. The piece of the patient information and the imaging condition have been specified for an imaging of the object. The generation part is configured to receive MR signals of the object with an amplification with the reception gain obtained by the reception gain acquisition part, and generate image data based on the received MR signals.

16 Claims, 9 Drawing Sheets

(56) References Cited

U.S. PATENT DOCUMENTS

| | | | | |
|---|---|---|---|---|
| 7,145,338 | B2* | 12/2006 | Campagna | G01R 33/56375 324/318 |
| 7,682,079 | B2* | 3/2010 | Schwartz | A61B 5/0555 378/117 |
| 8,228,063 | B2* | 7/2012 | Kimura | A61B 5/055 324/307 |
| 8,257,280 | B2* | 9/2012 | Levin | A61B 5/0537 600/547 |
| 8,547,097 | B2* | 10/2013 | Gebhardt | G01R 33/288 324/307 |
| 8,604,791 | B2* | 12/2013 | Vaughan, Jr. | G01R 33/3415 324/318 |
| 8,643,364 | B2* | 2/2014 | Umeda | G01R 33/3678 324/307 |
| 9,632,159 | B2* | 4/2017 | Paul | G01R 33/5607 |
| 9,746,532 | B2* | 8/2017 | Umeda | G01R 33/3678 |
| 9,835,700 | B2* | 12/2017 | Umeda | G01R 33/3628 |

FOREIGN PATENT DOCUMENTS

| | | |
|---|---|---|
| JP | 6-078899 | 3/1994 |
| JP | 2002-272702 | 9/2002 |
| JP | 2010-075634 | 4/2010 |
| JP | 2010-148686 | 7/2010 |

\* cited by examiner

| SEQUENCE | IMAGING PART | BMI< | COIL | RGN |
|---|---|---|---|---|
| FE | HEAD | 20 | HEAD | 20 |
| EPI | HEAD | 20 | HEAD | 50 |
| FSE | ABDOMEN | 30 | FLEX | 30 |
| FSE | ABDOMEN | 25 | BODY, SPINE | 20 |
| FASE | UNCONDITIONAL ACCORD | 100 | BODY, SPINE | -10 |
| 3D FFE | HEAD | 25 | HEAD | 3 |
| . | . | . | . | . |
| . | . | . | . | . |
| . | . | . | . | . |

FIG. 5

MAGNETIC RESONANCE IMAGING APPARATUS AND MAGNETIC RESONANCE IMAGING METHOD

CROSS REFERENCES TO RELATED APPLICATIONS

This application is based upon and claims the benefit of priorities from Japanese Patent Application No. 2013-260701 filed on Dec. 17, 2013 and Japanese Patent Application No. 2014-116132 filed on Jun. 4, 2014; the entire contents of all of which are incorporated herein by reference.

Further, the entire contents of Japanese Patent Application No. 2014-228500, filed on Nov. 10, 2014 are incorporated herein by reference.

FIELD

Embodiments described herein relate generally to an MRI (magnetic resonance imaging) apparatus and a magnetic resonance imaging method.

BACKGROUND

The MRI apparatus is an imaging diagnostic apparatus which magnetically excites nuclear spins of an object set in a static magnetic field with RF (radio frequency) signals having the Larmor frequency and reconstructs an image based on MR (magnetic resonance) signals generated due to the excitation.

In order to obtain images with a high SNR (signal to noise ratio) by an MRI apparatus, it is important to set the optimal reception gain of MR signals. If a reception gain of MR signals is not set appropriately, MR signals may be saturated in an imaging scan (a scan for acquiring diagnostic image data). In addition, large noises due to quantization or the like lead to deterioration in SNR. In this case, it may become impossible to generate images effective for a diagnosis.

The optimum reception gain of MR signals allows receiving MR signals using a large part of a dynamic range of an A/D (analog to digital) converter (ADC). However, intensities of MR signals change depending on factors, such as imaging conditions. Hence, the reception gain of MR signals is conventionally set for every imaging.

Specifically, a pre-scan (a scan preceding to an imaging scan) limited to an imaging area where MR signals are acquired with high intensities is performed under same conditions as those of an imaging scan. In the pre-scan, MR signals are acquired with a low reception gain which has been set as an initial value. Then, a reception gain RGN for an imaging scan can be determined by formula (1) based on the maximum value of the MR signals acquired in the pre-scan.

$$RGN = 20 \log_{10}(DR/\text{preMax}) + \text{pre}RGN \quad (1)$$

In formula (1), DR represents a dynamic range of an A/D converter, preMax represents the maximum value of MR signals acquired in a pre-scan, and preRGN represents an initial value of the reception gain.

In a pre-scan for determining a reception gain, MR signals whose echo number is smaller than that in an imaging scan are acquired. However, a pre-scan contributes to an increase in examination time since the pre-scan is performed for every imaging. Therefore, improvement in throughput of examinations is desired.

Accordingly, an object of the present invention is to provide a magnetic resonance imaging apparatus and a magnetic resonance imaging method which can determine a reception gain of MR signals in a shorter time.

BRIEF DESCRIPTION OF THE DRAWINGS

In the accompanying drawings:

FIG. 5 shows an example of table of reception gains of MR signals, appropriate for patient information and imaging conditions, stored in the reception gain database shown in FIG. 4;

DETAILED DESCRIPTION

In general, according to one embodiment, a magnetic resonance imaging apparatus includes a reception gain storage part, a reception gain acquisition part, and a generation part. The reception gain storage part is configured to store reception gains of magnetic resonance signals. The reception gains are related to at least one of pieces of patient information and imaging conditions. The reception gain acquisition part is configured to obtain a corresponding reception gain from the reception gain storage part, based on at least one of a piece of patient information and an imaging condition of an object. The piece of the patient information and the imaging condition have been specified for an imaging of the object. The generation part is configured to receive magnetic resonance signals of the object with an amplification with the reception gain obtained by the reception gain acquisition part, and generate image data based on the received magnetic resonance signals.

Further, according to another embodiment, a magnetic resonance imaging method comprising: storing reception gains of magnetic resonance signals; obtaining a corresponding reception gain based on at least one of a piece of patient information and an imaging condition of an object; and receiving magnetic resonance signals of the object with an amplification with the obtained reception gain and generating image data based on the received magnetic resonance signals. The stored reception gains are related to at least one of pieces of patient information and imaging conditions. The piece of the patient information and the imaging condition have been specified for an imaging of the object.

A magnetic resonance imaging apparatus and a magnetic resonance imaging method according to embodiments of the present invention will be described with reference to the accompanying drawings.

First Embodiment

Figure 1:
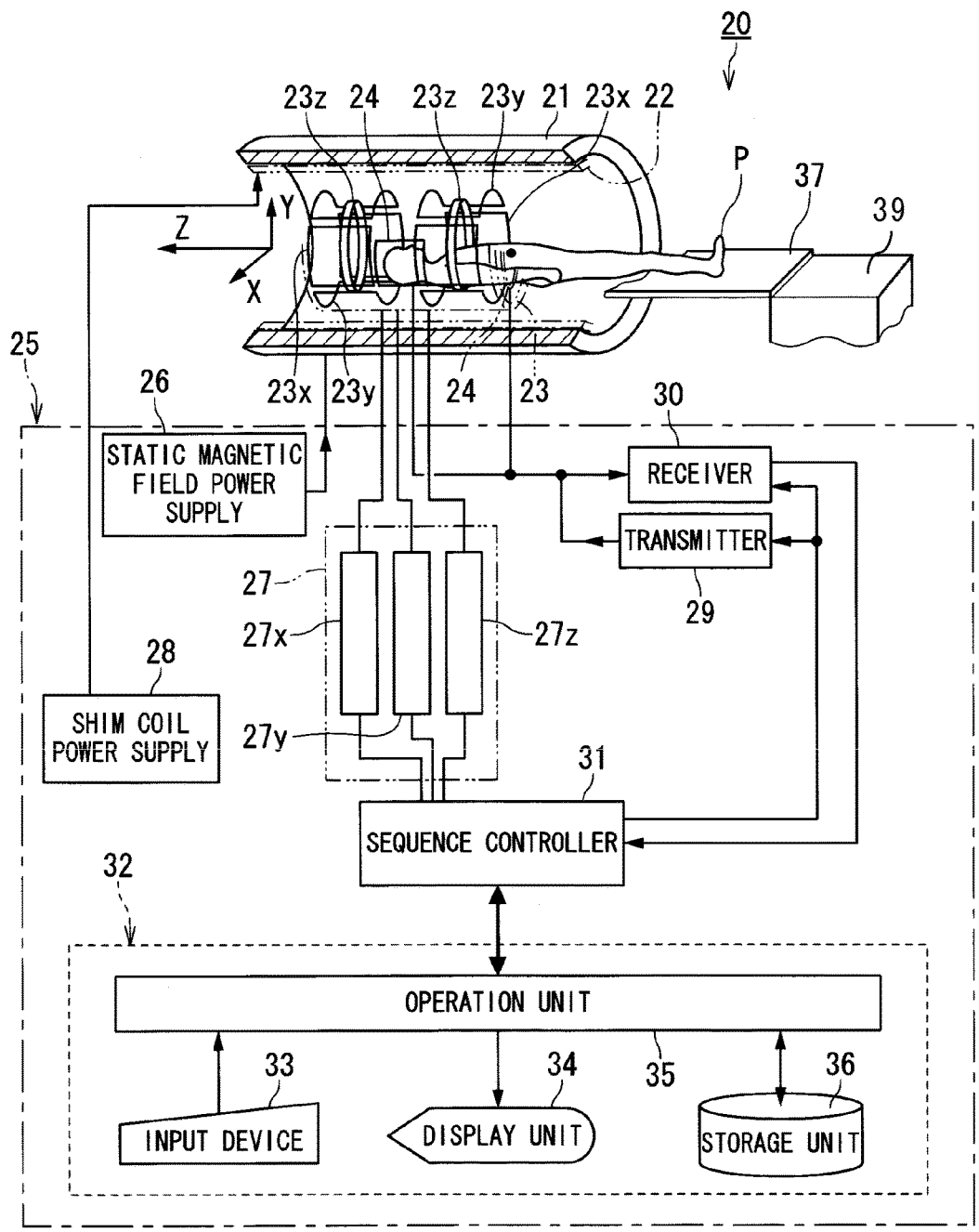
FIG. 1 is a block diagram showing a magnetic resonance imaging apparatus according to the first embodiment of the present invention.

FIG. 1 is a block diagram showing a magnetic resonance imaging apparatus according to the first embodiment of the present invention.

A magnetic resonance imaging apparatus 20 includes a cylinder-shaped static field magnet 21, a shim coil 22, a gradient coil 23 and RF coils 24. The static field magnet 21 generates a static magnetic field. The shim coil 22 is arranged inside the static field magnet 21.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z, which is cylinder-shaped, is arranged inside the static field magnet 21. The gradient coil 23 has also a bed 37 in the area formed inside it which is an imaging area. The bed 37 supports an object P. The RF coils 24 include a WBC (whole body coil), which is built in a gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 transmits RF signals given from the transmitter 29 to the object P. The reception RF coil 24 receives MR signals generated due to nuclear spins inside the object P which are excited by the RF signals to give to the receiver 30.

The sequence controller 31 of the control system 25 communicates with the gradient power supply 27, the transmitter 29 and the receiver 30. The sequence controller 3 firstores sequence information describing control information needed in order to drive the gradient power supply 27, the transmitter 29 and the receiver 30, and generates gradient magnetic fields Gx, Gy and Gz in the X, Y and Z directions and RF signals by driving the gradient power supply 27, the transmitter 29 and the receiver 30 according to a predetermined stored sequence. The above-described control information includes motion control information, such as intensities, application durations and application timings of electric current pulses which should be applied to the gradient power supply 27.

The sequence controller 31 is also configured to give raw data to the computer 32. The raw data, which are complex-valued data, are generated by the receiver 30 performing detection and A/D conversion of MR signals.

The transmitter 29 gives RF signals to the RF coil 24 in accordance with control information provided from the sequence controller 31. Meanwhile, the receiver 30 performs detection, necessary signal processing and A/D conversion of MR signals given from the RF coils 24 to generate raw data which are digitized complex-valued data. The generated raw data are given from the receiver 30 to the sequence controller 31.

The bed 37 is provided with a bed driving device 39. The bed driving device 39 is connected with the computer 32 so as to move a table of the bed 37 to a desired position under control by the computer 32. For imaging the object P, positioning of the bed 37 is performed so that an imaging position of the object P becomes a center of a magnetic field.

The computer 32 has various functions by the operation unit 35 executing programs stored in the storage unit 36 of the computer 32. Alternatively, specific circuits having various functions may be provided to the magnetic resonance imaging apparatus 20, instead of at least a part of the computer programs.

Figure 2:
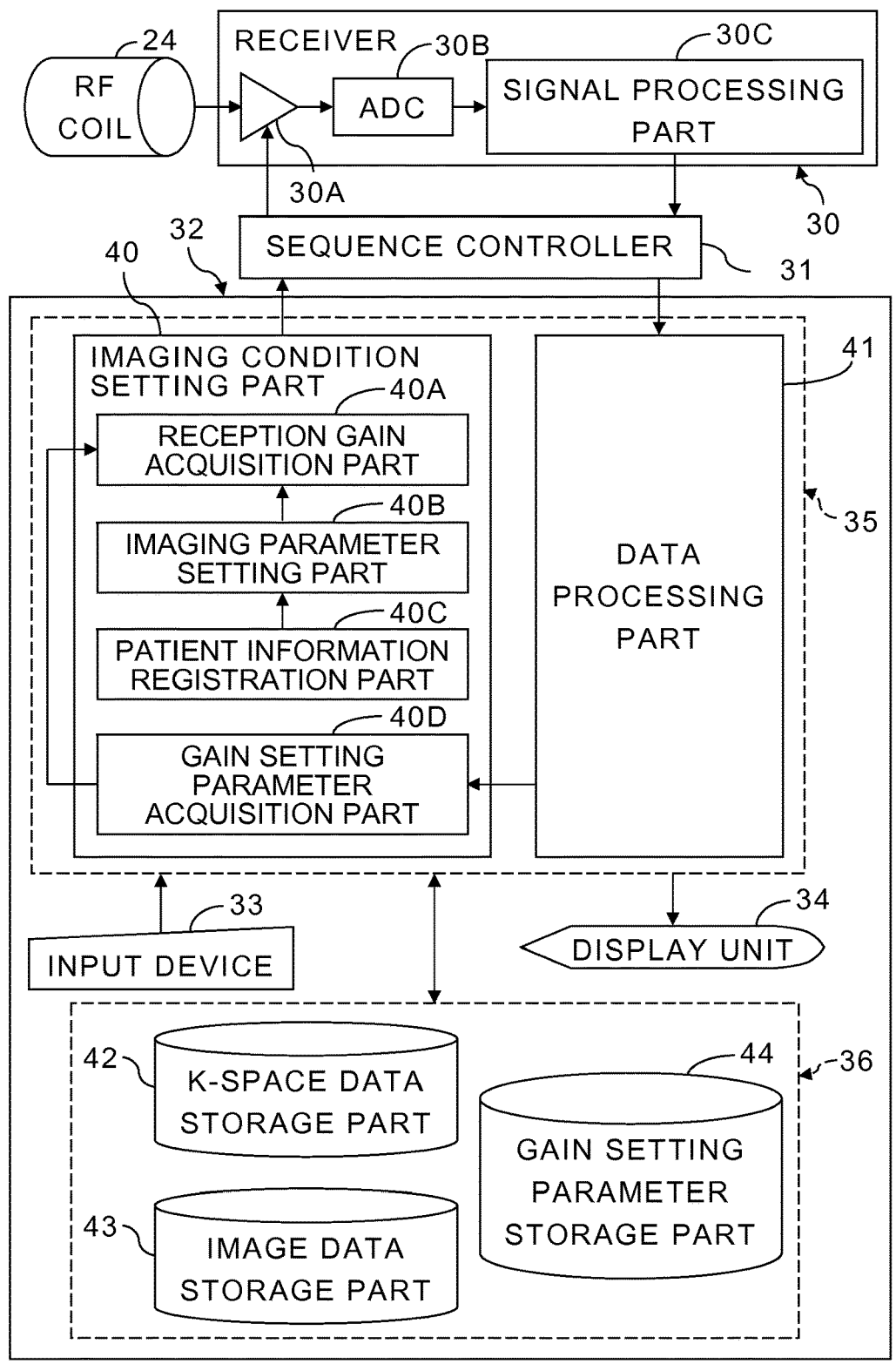
FIG. 2 is a functional block diagram of the receiver and the computer shown in FIG. 1.

FIG. 2 is a functional block diagram of the receiver 30 and the computer 32 shown in FIG. 1.

The output side of each RF coil 24 for receiving MR signals is connected with the receiver 30. The receiver 30 has an amplifier 30A, an A/D converter 30B and a signal processing part 30C. The amplifier 30A amplifies MR signals which are output from each RF coil 24. The A/D converter 30B performs A/D conversion of the amplified MR signals. The signal processing part 30C applies necessary signal processing to MR signals which have become digital signals by the A/D conversion. The MR signals after the signal processing by the signal processing part 30C are output to the computer 32 through the sequence controller 31.

The operation unit 35 of the computer 32 functions as an imaging condition setting part 40 and a data processing part 41 by running programs stored in the storage unit 36. The imaging condition setting part 40 has a reception gain acquisition part 40A, an imaging parameter setting part 40B, a patient information registration part 40C, and a gain setting parameter acquisition part 40D. The storage unit 36 functions as a k-space data storage part 42, an image data storage part 43, and a gain setting parameter storage part 44.

The imaging condition setting part 40 has a function to set imaging conditions including a pulse sequence based on direction information from the input device 33 and output the set imaging conditions to the sequence controller 31. A reception gain of MR signals set as an imaging condition in the imaging condition setting part 40 is output to the amplifier 30A of the receiver 30 through the sequence controller 31. Thereby, MR signals are amplified in the amplifier 30A with the reception gain set in the imaging condition setting part 40.

The reception gain acquisition part 40A of the imaging condition setting part 40 has a function to set a reception gain of MR signals as one of imaging conditions. Especially, the reception gain acquisition part 40A has a function to set a reception gain for receiving MR signals based on imaging conditions and reference data, corresponding to an imaging area, obtained prior to acquisition of MR signals for imaging.

As imaging conditions for setting a reception gain, imaging parameters, such as a TR (repetition time), a TE (echo time) and a TI (inversion time) of an IR (inversion recovery) pulse, which influence intensities of MR signals can be used. Note that, a TR is a time interval between one RF excitation pulse and the following RF excitation pulse, a TE is a time interval between the center of an RF excitation pulse and the peak of MR echo signals, and a TI is a time interval between an IR pulse and an RF excitation pulse.

On the other hand, as reference data referred to for setting a reception gain, image data obtained by a pre-scan from an imaging area which is a target for imaging can be used. Then, factors, characteristic to an object P at each spatial position, which influence intensities of MR signals can be obtained as parameters, based on reference image data obtained as the reference data. Then, a reception gain can be set based on the obtained parameters.

Examples of the factors characteristic to an object P at each spatial position, which influence intensities of MR signals include physical property values, such as the PD (proton density), the T1 (longitudinal relaxation time) and the T2 (transverse relaxation time). Spatial distributions of these physical property values can be obtained based on reference image data sets which have different contrasts. For example, a T1 distribution and a T2 distribution are calculable as attenuation time constants of signals at respective spatial positions, based on image signal values of reference image data sets corresponding to different TIs.

However, it might be difficult to obtain a T1 distribution and a T2 distribution in satisfactory accuracy based on a small number of data sets. Therefore, a spatial distribution of an index value corresponding to a physical property value may be obtained. Practical examples include a method of obtaining a relative amount of water and fat at every spatial position instead of directly obtaining a spatial distribution of a physical property value, such as a T1. That is, a relative amount of water and fat can be used as a parameter which indirectly shows a physical property value, such as a T1.

Therefore, a case of obtaining a relative amount of water and fat at every spatial position based on reference image data sets which have different contrasts will be described below as an example.

A relative amount of water and fat at every spatial position can be simply obtained based on image data sets, which have different contrasts, obtained as reference data by a pre-scan. For example, ratios of water and fat at respective spatial positions can be obtained as a distribution of fat signals (image signals in a fat region) by referring to signal values of subtraction image data between fat saturated image data and image data without a fat saturation.

When the relative amounts of the water and the fat at respective spatial positions have been obtained, a physical property value, such as a PD, a T1 or a T2, which influences intensities of MR signals, according to the relative amount of the water and the fat can be obtained approximately for the respective spatial positions. That is, rough spatial distributions of physical property values, such as a T1, a T2 and a PD, at imaging positions can be simply obtained.

Obtaining spatial distributions of physical property values, such as a T1, a T2 and a PD, makes it possible to estimate the maximum value of MR signals at every spatial position, using image signal values at respective spatial positions of reference image data obtained as reference data, the physical property values, such as a T1, a T2 and a PD, at every spatial position and imaging parameters, such as a TR, a TE and a TI. Then, an appropriate reception gain of MR signals corresponding to the maximum values of the MR signals can be set.

Furthermore, a reception gain can also be set using a coefficient corresponding to the RF coils 24 for acquiring MR signals for imaging. That is, an offset according to a type or the like of the RF coils 24 can be given to the reception gain. The coefficient, corresponding to the RF coils 24, for setting the reception gain can be defined empirically.

Formula (2) and formula (3) are examples of calculating formulas of a reception gain RGN in case of acquiring MR signals by an SE (spin echo) sequence.

$$Sp\max(x,y,z) = kS(x,y,z)[1-\exp\{-TR/T1(x,y,z)\}]\exp\{-TE/T2(x,y,z)\} \quad (2)$$

$$RGN = 20\log_{10}(DR/S\max) + preRGN \quad (3)$$

In formula (2) and formula (3), Spmax(x, y, z) represents the estimated maximum value of image signal values at an imaging position (x, y, z), k represents a coefficient characteristic to the RF coils 24 used for receiving MR signals, S(x, y, z) represents an image signal value of reference image data at an imaging position (x, y, z), T1(x y, z) represents a T1 according to a relative amount of water and fat at an imaging position (x y, z), T2(x, y, z) represents a T2 according to a relative amount of water and fat at an imaging position (x y, z), DR represents a dynamic range of the A/D converter 30B, Smax represents the maximum value of the estimated maximum values Spmax(x, y, z) of image signal values at all imaging positions (x, y, z), and preRGN represents an initial value of the reception gain.

The image signal values S(x, y, z) of the reference image data correspond to a sensitivity distribution of the RF coils 24. Therefore, the image signal values S(x, y, z) can be obtained by a pre-scan for acquiring a sensitivity map of the RF coils 24 as the reference image data. The characteristic coefficient k of the RF coils 24, which becomes a value according to a characteristic of circuits constituting the RF coils 24, can be determined empirically.

Formula (2) and formula (3) are examples of formulas for calculating a reception gain corresponding to a sequence of the SE series. In cases of a sequence of the FE (field echo) series or an IR sequence with an application of an IR pulse or IR pulses, the maximum value of image signal values corresponding to each imaging position can be similarly calculated based on physical property values, such as a T1, a T2 and a PD, at every position, imaging parameters, such as a TR, a TE and a TI, image signal values at respective positions acquired by a pre-scan, and a characteristic coefficient of the RF coils 24.

In the case of an FE sequence, T2(x, y, z) in formula (2) is replaced with T2 star T2*(x, y, z). Note that, when an FA (flip angle) of an RF pulse is a, the estimated maximum value Spmax(x, y, z) of image signal values at each imaging position (x, y, z) can be obtained by formula (4).

$$Sp\max(x,y,z)=kS(x,y,z)\sin \alpha[1-\exp\{-TR/T1(x,y,z)\}]$$
$$\exp\{-TE/T2^*(x,y,z)\}/[1-\cos \alpha\exp\{-TR/T1(x,y,z)\}] \quad (4)$$

Alternatively, in the case of an IR sequence of the SE series, the estimated maximum value Spmax(x, y, z) of image signal values at each imaging position (x, y, z) can be obtained by formula (5).

$$Sp\max(x,y,z)=kS(x,y,z)[1-2\exp\{-TI/T1(x,y,z)\}][1-\exp\{-TR/T1(x,y,z)\}]\exp\{-TE/T2(x,y,z)\} \quad (5)$$

Note that, in the case of an IR sequence of the FE series, T2(x, y, z) in formula (5) is replaced with T2*(x, y, z).

Thus, the maximum value of image signal values corresponding to each imaging position is calculable using a theoretical formula, which obtains the maximum value of image signals by considering a change of signal intensities due to the relaxation. Then, an appropriate reception gain can be set so as to prevent a dynamic range of the A/D converter 30B from being saturated even when an image signal having the maximum value has been acquired.

That is, a reception gain can be calculated by an operation using at least one of physical property values, such as a PD, a T1 and a T2 at each spatial position according to a relative amount of water and fat, and at least one of imaging parameters, such as a TR, a TE and a TI in an IR method, according to an imaging sequence.

A physical property value, such as a T1, according to a relative amount of water and fat, which is necessary for calculating a reception gain can be obtained by adding the physical property value of the water to that of the fat with a weight according to the relative amount of the water and the fat. In this case, distribution data of the physical property value have multiple values corresponding to the relative amounts of the water and the fat.

However, a distribution of physical property value according to relative amounts of water and fat may be a distribution having values of either the physical property value corresponding to the water or that corresponding to the fat, in order to reduce an amount of data processing and an amount of data.

That is, T1(x, y, z) according to relative amounts of water and fat in formula (2) may be distribution data, having two values, which have either the T1 of water or the T1 of fat. Similarly, T2(x, y, z) according to relative amounts of water and fat may be distribution data, having two values which have either the T2 of water or the T2 of fat. Thereby, calculation of a reception gain can be simplified.

When distribution data of a physical property value show two values of a physical property value of water and that of fat, what is necessary is only to specify whether each spatial position corresponds to water or fat. Therefore, respective spatial positions can be classified into positions corresponding to fat and positions corresponding to water by threshold processing of pixel values of subtraction image data between fat saturated image data and non-fat saturated image data, for example. That is, each spatial position, at which at least a certain amount of fat saturation effect can be obtained, can be determined to be a position corresponding to fat. Meanwhile, the other spatial positions can be determined to be positions corresponding to water.

By the above mentioned threshold processing of pixel values of subtraction image data between fat saturated image data and non-fat saturated image data, spatial positions can be classified into water and fat. Then, physical property values of water or fat can be allocated to each spatial position. Accordingly, the maximum values of image signals at positions corresponding to water and the maximum values of image signals at positions corresponding to fat can be respectively calculated by formula (2) or the like, and a reception gain can be simply calculated from the maximum values of the image signals by formula (3).

Therefore, at least image signal values at spatial positions of reference image data obtained by a pre-scan or values, corresponding to the image signal values, such as multiplied values of a characteristic coefficient of the RF coils 24 and the image signal values, can be used as parameters at the respective spatial positions for setting a reception gain. In addition, a relative amount of water and fat at each spatial position or physical property values, at each spatial position, corresponding to the relative amount of water and fat can be used as a parameter or parameters at each spatial position for setting a reception gain. Further, information for identifying whether each spatial position is water or fat may be a parameter for setting a reception gain, in order to simplify data processing.

The imaging parameter setting part 40B has a function to set imaging parameters for imaging, such as a TR, a TE, and a TI. The set imaging parameters are notified to the reception gain acquisition part 40A for setting a reception gain.

The patient information registration part 40C has a function to register patient information including a name, height, and weight of an object P, which is a target for imaging, according to direction information input from the input device 33. The patient information, referred to as conditions for setting imaging parameters, among the registered patient information is notified to the imaging parameter setting part 40B.

The gain setting parameter acquisition part 40D has a function to obtain reference image data obtained by a pre-scan, from the data processing part 41, as reference data, and obtain the above mentioned parameters, such as a distribution of fat signals or relative amounts of water and fat, used for setting a reception gain in reception gain acquisition part 40A, based on the reference data. The obtained parameters for setting a reception gain are notified to the reception gain acquisition part 40A from the gain setting parameter acquisition part 40D.

The parameters, for setting a reception gain, obtained by the gain setting parameter acquisition part 40D can be stored at the gain setting parameter storage part 44. In addition, previously obtained parameters for setting a reception gain can be also stored at the gain setting parameter storage part 44. Specifically, among parameters which are necessary to calculate a reception gain by formulas exemplified by formula (2) to formula (5), parameters other than imaging parameters can be stored at the gain setting parameter storage part 44.

For example, in case of calculating a reception gain by formula (2) and formula (3), a characteristic coefficient k of the RF coils 24 used for receiving MR signals, image signal values S(x, y, z) of reference image data at imaging positions (x, y, z), T1(x, y, z) at imaging positions (x, y, z), and T2(x, y, z) at imaging positions (x, y, z) can be stored as parameters at the gain setting parameter storage part 44.

However, it is often difficult to obtain a T1 distribution T1(x, y, z) and a T2 distribution T2(x, y, z) with high accuracy based on data obtained by a pre-scan as mentioned above. Therefore, relative amounts of water and fat at imaging positions (x, y, z) may be stored as parameters at the gain setting parameter storage part 44, instead of the T1 distribution T1(x, y, z) and the T2 distribution T2(x, y, z). Alternatively, information for identifying whether respective imaging positions (x, y, z) are water or fat may be stored as parameters at the gain setting parameter storage part 44.

In addition, values derived by multiplying a coefficient k of the RF coils 24 with image signal values S(x, y, z) of reference image data may be stored as parameters at the gain setting parameter storage part 44. Furthermore, other coefficients may be used as necessary. Therefore, the gain setting parameter storage part 44 can store image signal values S(x, y, z) of reference image data or values corresponding to the image signal values S(x, y, z) of the reference image data as parameters.

Thus, parameters, for setting a reception gain, which are once obtained at the gain setting parameter acquisition part 40D can be repeatedly used by referring to the gain setting parameter storage part 44.

Therefore, when new imaging conditions including imaging positions which can be considered as same as imaging positions set as an imaging condition of a same object P have been set, a new reception gain for receiving new MR signals can be set in the reception gain acquisition part 40A based on existing reference data and the new imaging conditions. Similarly, when new imaging conditions including imaging positions which can be considered as a part of imaging positions set as an imaging condition have been set, a new reception gain for receiving new MR signals can be set based on existing reference data and the new imaging conditions.

In other words, when imaging positions are the same, an appropriate reception gain corresponding to new imaging conditions can be set based on imaging parameters and parameters stored in the gain setting parameter storage part 44, without a newly performed pre-scan.

The imaging condition setting part 40 having the above-mentioned functions of the computer 32 functions as a data acquiring system configured to acquire MR signals from an imaging area of an object P according to imaging conditions, by cooperating with hardware including the static field magnet 21, the shim coil 22, the gradient coil 23 and the RF coils 24. However, the data acquiring system may be configured by other elements as long as similar functions are provided. Furthermore, this data acquiring system has a function to acquire MR signals for generating reference data by a pre-scan which precedes an imaging scan for acquiring MR signals. When possible, it is efficient to use the pre-scan for acquiring MR signals for generating reference data as a pre-scan for acquiring locator image data.

On the other hand, the data processing part 41 has a function as a data processing system configured to generate image data based on MR signals acquired by a scan, such as an imaging scan or a pre-scan. Specifically, the data processing part 41 has a function to obtain MR signals, which have been acquired by a scan under imaging conditions set in the imaging condition setting part 40, from the sequence controller 31 and arrange the obtained MR signals in a k-space formed in the k-space data storage part 42; a function to take k-space data from the k-space data storage part 42 and reconstruct image data by image reconstruction processing including an FT (Fourier transform); a function to write image data, obtained by the image reconstruction processing, into the image data storage part 43; and a function to perform necessary image processing of image data taken from the image data storage part 43 and display the processed image data on the display unit 34.

Especially, image data generated by image reconstruction processing of MR signals acquired by a pre-scan can be used for obtaining parameters for setting a reception gain in the gain setting parameter acquisition part 40D.

Next, an operation and action of the magnetic resonance imaging apparatus 20 will be described.

Figure 3:
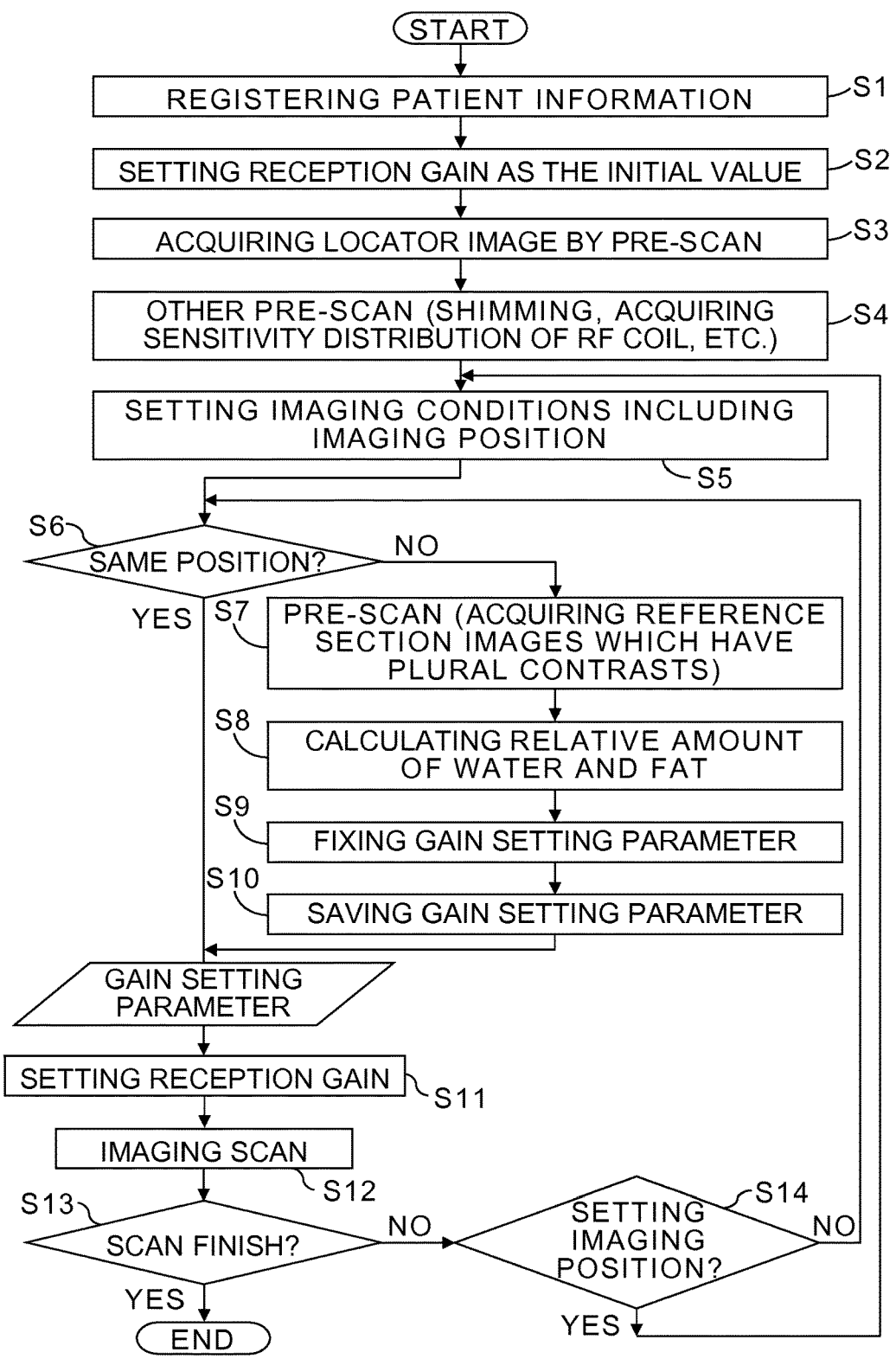
FIG. 3 is a flow chart which shows an example of operation of the magnetic resonance imaging apparatus shown in FIG. 1.

FIG. 3 is a flow chart which shows an example of operation of the magnetic resonance imaging apparatus 20 shown in FIG. 1. Here, description is made for an example case of obtaining relative amounts of water and fat at imaging positions as parameters based on reference image data acquired by a pre-scan and setting a reception gain of MR signals for an imaging scan based on the relative amounts of the water and the fat.

First, the object P is previously set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Next, in Step S1, patient information, such as a name, height, and weight, of the object P is registered by the patient information registration part 40C with operating the input device 33. The patient information referred to as conditions for setting imaging parameters among the registered patient information is notified to the imaging parameter setting part 40B.

Next, in Step S2, the reception gain acquisition part 40A sets a reception gain of MR signals to an initial value. Specifically, an enough low gain is set as the initial value of a reception gain of MR signals by the reception gain acquisition part 40A so that the dynamic range of the A/D converter 30B in the receiver 30 should not be saturated. For example, the initial value of a reception gain may be set to zero, or a positive or negative value whose absolute value is small.

Next, in Step S3, locator image data are acquired by a pre-scan. Typically, reference image data of orthogonal three sections, such as axial section image data, coronal section image data, and sagittal section image data, of the object P, are acquired by the pre-scan.

Specifically, the imaging condition setting part 40 outputs imaging conditions, including a pulse sequence and the reception gain of MR signals which has been set to the initial value, to the sequence controller 31. Then, the sequence controller 31 drives the gradient power supply 27, the transmitter 29, and the receiver 30 in accordance with the pulse sequence, thereby generating a gradient magnetic field at the imaging area having the set object P, and further generating RF signals from the RF coils 24.

Consequently, the RF coils 24 receive MR signals generated due to the nuclear magnetic resonance in the object P. Then, the receiver 30 receives the MR signals from the RF coils 24 and performs necessary signal processing. Specifically, the amplifier 30A of the receiver 30 amplifies the MR signals with the initial value of the reception gain given as a control signal from the sequence controller 31. Next, the A/D converter 30B performs A/D conversion of the amplified MR signals. Then, the signal processing part 30C performs necessary signal processing of the A/D converted MR signals. The MR signals after the signal processing are output from the signal processing part 30C through the sequence controller 31 to the computer 32.

In the computer 32, the data processing part 41 arranges the MR signals in a k-space formed in the k-space data storage part 42. Subsequently, reference image data are generated as locator image data by image reconstruction processing which uses the MR signals arranged in the k-space as its original data. Typically, the orthogonal three section image data as reference, such as the axial section image data, the coronal section image data, and the sagittal section image data, of the object P are generated as the locator image data. Thereby, a user can refer to the locator image data and can set data acquisition regions for other pre-scans performed sequentially and an imaging region of diagnostic images.

Next, in Step S4, the other pre-scans to be performed in prior to imaging scans for acquiring diagnostic image data are performed. Examples of a pre-scan other than the pre-scan in purpose of acquiring the locator image data include a pre-scan to acquire data for shimming of the static magnetic field and a pre-scan to acquire data for estimating sensitivity distributions of the RF coils 24.

Next, in Step S5, imaging conditions including imaging positions for an imaging scan are set in the imaging condition setting part 40. For example, the imaging parameters, such as a TR, a TE, and a TI, for the imaging scan, are set in the imaging parameter setting part 40B.

Next, in Step S6, the reception gain acquisition part 40A in the imaging condition setting part 40 judges whether a position of the object P has been changed or not, due to a movement of the bed 37 or the like. When imaging positions for an imaging scan have been newly set or when different imaging positions have been set, it is judged that the imaging positions should not be the same. In this case, the imaging condition setting part 40 becomes in a standby state that waits for a direction for performing a pre-scan for obtaining parameters to set a reception gain of MR signals.

Next, in Step S7, the direction for performing the pre-scan is input from the input device 33 to the imaging condition setting part 40, together with imaging conditions including imaging parameters and direction information of imaging sections. Thereby, the pre-scan, of the object P, for obtaining the parameters required for setting a reception gain of MR signals in the amplifier 30A of the receiver 30 is performed.

As a specific example, reference sections, such as axial sections, sagittal sections, and coronal sections, of the object P, are set as the imaging sections with a large imaging field of view which covers an imaging region for the imaging scan. Alternatively, resolutions of the images may be set low and/or data acquisition conditions to acquire one dimensional (1D) MR data may also be set, in order to shorten the data acquisition time.

Specifically, as the conditions for the pre-scan to obtain the setting parameters of a reception gain, it is desired that the matrix size should be set small from a viewpoint of shortening the data acquisition time and that the field of view (FOV) should be set large from a viewpoint of obtaining the appropriate setting parameters of a reception gain.

Besides, imaging parameters, such as TRs, TEs, and TIs, are set for the pre-scan so that multiple frames of image data which have different contrasts should be acquired. As a preferred example, imaging conditions for acquiring fat saturated image data with application of a fat saturation pulse, such as a short TI inversion recovery (STIR) pulse, and imaging conditions for acquiring PD image data without fat saturation are set.

Then, when a start direction of the pre-scan is input from the input device 33 into the imaging condition setting part 40, MR signals for obtaining the setting parameters of the reception gain are acquired with setting the reception gain of MR signals to the initial value. In the data processing part 41 of the computer 32, image reconstruction processing which uses the MR signals acquired by the pre-scan as its original data is performed. Thereby, multiple frames of image data, which have different contrasts, are generated. As a preferred example, fat saturated image data and PD image data are acquired.

Next, in Step S8, a relative amount of water and fat in the imaging region is calculated for each spatial position by the gain setting parameter acquisition part 40D. The relative amounts of the water and the fat can be calculated by an arbitrary method based on the image data sets whose contrasts are different.

As a practical example, when subtraction image data between fat saturated image data and non-fat saturated image data, such as PD image data, are generated, the subtraction image data show large pixel values at the pixel positions where the fat suppression effect is high and pixel values close to zero at the pixel positions where the fat suppression effect is small. Therefore, it can be considered that an amount of the fat should be large at each pixel position where the pixel value of the subtraction image data is large while an amount of the fat should be small at each pixel position where the pixel value is close to zero. That is, the subtraction image data can be considered to be a distribution of the fat signals.

Then, when the subtraction image data between the fat saturated image data and the non-fat saturated image data are normalized with the maximum value of the pixel values of the subtraction image data, for example, the ratios of the fat at the respective pixel positions can be numerically expressed. As a result, the relative amount of the fat and the water can be obtained for each pixel position.

Next, in Step S9, the gain setting parameter acquisition part 40D settles parameters, characteristic to an imaging part of the object P, for setting the reception gain of MR signals. Specifically, the relative amounts of the fat and the water at the spatial positions in the imaging part of the object P, and the signal values of the image data, at the spatial positions in the imaging part of the object P, obtained by the pre-scan can be used as the parameters for setting the reception gain.

Next, in Step S10, the gain setting parameter acquisition part 40D relates the parameters, at each spatial position, for setting the reception gain, with an imaging position in the body coordinate system of the object P, and stores them in the gain setting parameter storage part 44.

Next, in Step S11, the reception gain acquisition part 40A sets the reception gain of MR signals for the imaging scan with referring to the parameters, for setting the reception gain, stored in the gain setting parameter storage part 44, and the imaging parameters, such as the TR, the TE, and the TI, set as the imaging conditions for the imaging scan. Therefore, the imaging parameters, such as the TR, the TE, and the TI, for the imaging scan are notified from the imaging parameter setting part 40B to the reception gain acquisition part 40A.

Specifically, as shown by the formula (2) to the formula (5), an appropriate reception gain of MR signals can be set based on the imaging parameters, such as the TR, the TE, and the TI, for the imaging scan, physical property values, such as T1s and T2s, and PDs, which influence intensities of MR signals, at the respective positions, the image signal values at the respective positions acquired by the pre-scan, and the coefficient characteristic to the RF coils 24. The physical property values, such as the T1s, the T2s, and the PDs, at the respective spatial positions can be determined based on the relative amounts of the water and the fat, at the respective spatial positions, stored as the parameters, and the T1 values and the T2 values of the fat and the water.

In a case that the physical property values at each spatial position are obtained by a simple method, the method, by which the spatial positions are classified into the positions corresponding to the fat and the positions corresponding to the water according to the relative amounts of the fat and the water, and subsequently, the physical property values corresponding to the fat are assigned to the positions corresponding to the fat while the physical property values corresponding to the water are assigned to the positions corresponding to the water, can be adopted. In this case, physical property value distribution data having two values consisting of the physical property value corresponding to the water and the physical property value corresponding to the fat are obtained for each physical property value such as the T1, the T2, and the PD. Then, the reception gain can be calculated using the distribution data of the physical property values.

Next, in Step S12, the imaging scan is performed in a flow similar to that of the pre-scan. However, the reception gain set by the reception gain acquisition part 40A in Step S11 is used for the imaging scan. Therefore, the reception gain set by the reception gain acquisition part 40A is given from the imaging condition setting part 40, through the sequence controller 31, to the amplifier 30A in the receiver 30

When diagnostic image data have been acquired by the imaging scan, the imaging condition setting part 40 judges whether all imaging scans have been completed or not in Step S13. In a case that an imaging scan is repeated for the same object P, it is judged that all the imaging scans have not been completed. Then, in Step S14, the imaging condition setting part 40 judges whether imaging positions are anew set in order to perform the next imaging scan or not. When the imaging condition setting part 40 is in the state of waiting for designation of imaging positions, for example, the imaging condition setting part 40 can judge that imaging positions are anew set.

When imaging positions are anew set, imaging conditions including the imaging positions are set in Step S5 again. Then, in Step S6, it is judged whether the anew set imaging positions are considered to be the same as the imaging positions of the last imaging scan. When the imaging positions has changed beyond an acquisition region of the physical property value distribution data, such as a case that the bed 37 was moved by a non-negligible distance, it is judged that the imaging positions are not the same.

Moreover, even in a case that imaging positions are not anew set, the position of the imaging part of the object P relative to the bed 37 may change due to a non-negligible motion of the object P. Therefore, even in a case that imaging positions are not anew set, it is appropriate to judge whether the imaging positions have changed or not in Step S6.

When it is judged that the imaging positions have changed, the reception gain is similarly set again along the flow including the pre-scan from Step S7 to Step S11. As a result, parameters for setting the reception gain corresponding to the new imaging positions are stored in the gain setting parameter storage part 44. That is, the parameters, which have been stored in the gain setting parameter storage part 44, for setting the reception gain, are updated.

Note that, the information, which indicates whether the imaging positions are the same or not, may be input from the input device 33 into the imaging condition setting part 40 so that the imaging condition setting part 40 can perform the judgment in Step S6. Moreover, the imaging condition setting part 40 may recognize a change in imaging positions based on moving direction information of the bed 37 input from the input device 33 into the imaging condition setting part 40.

When the object P has moved relative to the bed 37 or when the bed 37 has moved, a direction for acquiring locator images by a pre-scan is input from the input device 33 into the imaging condition setting part 40. Therefore, when direction information with regard to acquisition of locator images has been input from the input device 33 into the imaging condition setting part 40, the imaging condition setting part 40 may judge that the imaging positions have changed. However, illustration of a pre-scan for acquiring locator images anew is omitted.

As mentioned above, in the case that the imaging positions have changed, a pre-scan for acquiring locator images anew is performed usually. Therefore, it is efficient that the pre-scan for the acquisition of the locator images doubles the pre-scan for the determination of the reception gain in Step S7. That is, the data acquisition required for setting the reception gain can be performed in the pre-scan for the acquisition of the locator images. Thereby, increase of pre-scans, which should be performed when the imaging positions have changed, can be avoided.

At the acquisition time of the locator images required for setting the first imaging positions in Step S3, the initial value of the reception gain can be used. Since it is efficient for the acquisitions of the second and following locator images to be performed by the pre-scan in Step S7, the initial value of the reception gain is also used in these cases.

However, the pre-scan for obtaining the setting parameters for the reception gain in Step S7 may be performed prior to one of the respective pre-scans in Step S3 and Step S4. In that case, a reception gain for a desired pre-scan among the pre-scans in Step S3 and Step S4 can be set to an appropriate value, other than the initial value, according to its data acquisition positions. That is, a reception gain for a desired pre-scan among the pre-scans in Step S3 and Step S4 may be obtained similarly to a reception gain for an imaging scan.

On the other hand, when the imaging positions of the next imaging scan are judged to be the same as the imaging positions in the past, in the judgment of Step S6, the pre-scan for setting the reception gain is unnecessary because the parameters, corresponding to the imaging positions, required for setting the reception gain have already been stored in the gain setting parameter storage part 44. That is, the flow including the pre-scan from Step S7 to Step S10 can be omitted.

Then, in Step S11, the reception gain can be calculated using the imaging parameters of the next imaging scan and the parameters stored in the gain setting parameter storage part 44. That is, even when the imaging parameters are different, an appropriate reception gain can be calculated using updated imaging parameters so long as the imaging positions can be considered to be the same.

Therefore, when a pre-scan for acquiring locator images is performed without changing imaging positions after a pre-scan for setting a reception gain has been performed, the reception gain calculated in Step S11 can be used for the pre-scan for acquiring the locator images. Furthermore, in that case, the reception gain for the imaging scan should be calculated again using the imaging parameters for the imaging scan after the acquisition of the locator images when the imaging parameters for the pre-scan for acquiring the locator images differ from the imaging parameters of the imaging scan.

Thus, when the next imaging positions can be considered to be the same as the past imaging positions, the pre-scan for setting the reception gain can be omitted regardless of the scan being an imaging scan or a pre-scan. In other word, the number of the times of the pre-scans to be performed to set a reception gain can be once for one same imaging positions.

That is, the magnetic resonance imaging apparatus 20 mentioned above is to obtain parameters, which influence intensities of MR signals, characteristic to an object P, for each spatial position, based on reference data acquired by a pre-scan, so that a reception gain of MR signals can be appropriately set using the obtained parameters and imaging parameters. Furthermore, the magnetic resonance imaging apparatus 20 is to store parameters obtained for setting a reception gain so that a reception gain can be set without a pre-scan when imaging positions of an object P can be considered to be same.

Therefore, according to the magnetic resonance imaging apparatus 20, a pre-scan for setting a reception gain of MR signals is unnecessary so long as imaging positions of an object P are generally a same, even when imaging parameters such as a TR, a TE, and a TI are different. As a result, an imaging time can be shortened and improvement in throughput of examinations can be attained.

Second Embodiment

In the magnetic resonance imaging apparatus in the second embodiment, the functions of the computer 32 are different from those of the magnetic resonance imaging apparatus 20 in the first embodiment. The other configurations and actions of the magnetic resonance imaging apparatus in the second embodiment do not differ from those of the magnetic resonance imaging apparatus 20 in the first embodiment substantially. Therefore, only a functional block diagram of the receiver 30 and the computer 32 is illustrated, and same signs are attached with same elements and corresponding elements and detailed explanation thereof is omitted.

Figure 4:
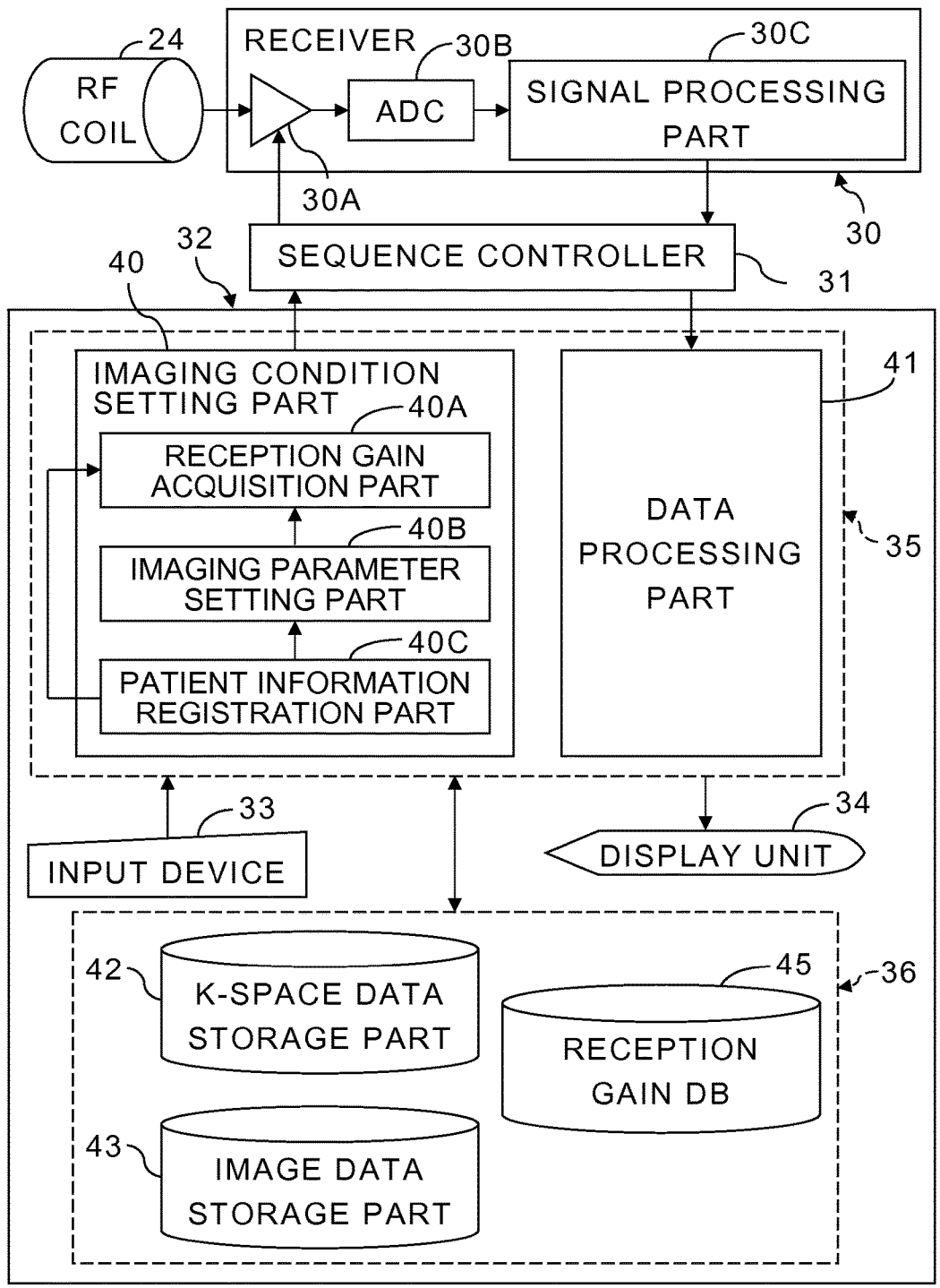
FIG. 4 is a functional block diagram of the receiver and the computer included in the magnetic resonance imaging apparatus according to the second embodiment of the present invention.

FIG. 4 is a functional block diagram of the receiver 30 and the computer 32 included in the magnetic resonance imaging apparatus according to the second embodiment of the present invention.

The imaging condition setting part 40 in the second embodiment has the reception gain acquisition part 40A, the imaging parameter setting part 40B, and the patient information registration part 40C. Moreover, the storage unit 36 functions as the k-space data storage part 42, the image data storage part 43, and a reception gain database 45.

The imaging condition setting part 40 has a function to set imaging conditions including a pulse sequence based on direction information from the input device 33 and output the set imaging conditions to the sequence controller 31. A reception gain of MR signals set as an imaging condition in the imaging condition setting part 40 is output to the amplifier 30A of the receiver 30 through the sequence controller 31. Thereby, MR signals are amplified in the amplifier 30A with the reception gain set in the imaging condition setting part 40.

The reception gain acquisition part 40A in the imaging condition setting part 40 has a function to set a reception gain of MR signals as one of imaging conditions. Especially, the reception gain acquisition part 40A is configured to set an appropriate reception gain according to at least one of patient information of an object P and imaging conditions based on at least one of the patient information and the imaging conditions when the patient information and the imaging conditions have been specified for the imaging of the object P.

The reception gain database 45 has a function as a reception gain storage part that stores reception gains of MR signals related to at least one of pieces of patient information and imaging conditions. Therefore, the reception gain acquisition part 40A can obtain a corresponding reception gain from the reception gain database 45, based on at least one of patient information of an object P and imaging conditions specified for imaging of the object P.

FIG. 5 shows an example of table of reception gains of MR signals, appropriate for patient information and imaging conditions, stored in the reception gain database 45 shown in FIG. 4.

As shown in FIG. 5, multiple appropriate values RGNs of reception gains corresponding to at least one of multiple different pieces of patient information and multiple different sets of imaging conditions can be stored in the reception gain database 45. In the example shown in FIG. 5, identification information of an imaging sequence, an imaging part of an object P, and identification information of used RF coils 24 have been used as imaging conditions for variable setting of an appropriate reception gain. Moreover, variations RGNs from an initial value have been stored as values for specifying reception gains. Surely, values of reception gains may directly be stored in the reception gain database 45.

Specifically, a name for specifying an imaging sequence is used as one of the imaging parameters indicating the imaging conditions for determining a reception gain. Examples of a name for specifying an imaging sequence include an FE sequence, an EPI (echo planar imaging) sequence, an FSE (fast spin echo) sequence, an FASE (fast advanced spin echo/fast asymmetric spin echo) sequence, and a 3D FFE (three dimensional fast field echo) sequence.

In addition, an imaging part, such as a head and an abdomen, and identification information of the RF coils 24, such as a head coil, a flex coil, a body coil, and a spine coil, can also be used as one of the imaging parameters for determining a reception gain. Note that, for the RF coils 24 used for imaging, only identification information of the RF coils 24 whose reception sensitivities are especially low, or only identification information of the RF coils 24 whose reception sensitivities are especially high may be related to appropriate reception gains, as an imaging parameter. Moreover, a table for specifying a reception gain may be generated with an unconditional accord instead of specifying a certain value of an imaging parameter.

A single or multiple desired imaging parameters can be related with the reception gains. Therefore, at least one of identification information of imaging sequences, imaging parts of an object P, and identification information of used RF coils 24 can be related to reception gains and stored as an imaging condition related to the reception gains in the reception gain database 45.

On the other hand, in the example shown in FIG. 5, the body mass index (BMI) indicating an obesity degree of an object P is used as a parameter, which indicates patient information, for determining a reception gain. Especially, a ratio of a fat signal amount included in MR signals is dominant as a parameter for optimization of a value of a reception gain. Therefore, it is preferred to relate pieces of information, each directly or indirectly indicating a ratio of a fat signal amount included in MR signals, with reception gains and store the pieces of the information related to the reception gains in the reception gain database 45.

Examples of information indicating a ratio of a fat signal amount included in MR signals include a weight of an object P, information indicating water excitation conditions, information indicating application conditions of an IR pulse or IR pulses, information indicating conditions of shimming, and information indicating application conditions of a fat saturation pulse or fat saturation pulses, in addition to a BMI. Therefore, multiple pieces of information, each indicating a ratio of a fat signal amount included in MR signals, may be combined with each other as parameters so that a signal amount from fat can be estimated more precisely.

Therefore, it is appropriate to relate each of reception gains with at least one of a weight of an object P, information indicating water excitation conditions, information indicating application conditions of an IR pulse or IR pulses, information indicating conditions of shimming, information indicating application conditions of a fat saturation pulse or fat saturation pulses, and a BMI of an object P, as information indicating a ratio of a fat signal amount, and store the related reception gains in the reception gain database 45. Note that, specific examples of the application conditions of RF pulses, such as IR pulses, water excitation pulses, and fat saturation pulses, include whether RF pulses are applied, FAs, kinds of RF pulses, the number of applied RF pulses, and parameters, such as TIs, for specifying application timings of RF pulses.

The parameters, indicating patient information or imaging conditions, for determining a value of a reception gain, stored in the reception gain database 45 may be not values but ranges of values. In other words, not only values of parameters indicating patient information or imaging conditions but also ranges of the values of the parameters may be related with appropriate values of reception gains and stored as a table in the reception gain database 45.

Moreover, in a case of a parameter, such as a BMI, which can have continuous values, an appropriate value of a reception gain may be determined by a function or functions relating values of the parameter with appropriate values of reception gains. In that case, a function or functions for calculating an appropriate value of a reception gain based on a value of a parameter or values of parameters are stored in the reception gain database 45.

The function or the functions for calculating an appropriate value of a reception gain can be determined theoretically based on a simulation, design specifications, or the like. Alternatively, the function or the functions may be determined experientially based on actual measurement. When a function for calculating a value of a reception gain is determined by actual measurement, what is necessary is to define a linear function or an arbitrary nonlinear function, such as a high dimensional function, an exponential function, or a logarithmic function, and obtain coefficients of the defined function by curve fitting or the like. In this case, a value of a reception gain corresponding to a desired value of a parameter is calculated by interpolation.

Meanwhile, in case of parameters, such as whether an IR pulse is applied or not and identification information of the RF coils 24, whose values or ranges of the values are related to appropriate values of reception gains one to one, the parameters can be also determined theoretically based on a simulation, design specifications, or the like. Alternatively, the parameters can be determined experientially based on actual measurement.

When information for determining an appropriate value of reception gain according to patient information and/or imaging conditions, as mentioned above, is stored in the reception gain database 45, the reception gain acquisition part 40A can easily obtain an appropriate value of reception gain by comparing conditions specified for imaging of an object P with the conditions stored in the reception gain database 45, without a special pre-scan. That is, a value of a reception gain, to which corresponding all conditions agree, can be set as a value of reception gain for imaging.

Especially, when a table for obtaining a value of a reception gain using information, indicating a ratio of a fat signal amount included in MR signals, as a condition is stored in the reception gain database 45, the reception gain acquisition part 40A can acquire a corresponding reception gain from the reception gain database 45, based on information, specified for imaging, which indicates a ratio of a fat signal amount extremely dominant on the determination of an appropriate value of reception gain.

When a value of reception gain whose conditions agree has not been stored in the reception gain database 45, a reception gain for imaging can be determined by a pre-scan whose initial value of reception gain has been set to zero or a sufficiently small value. Specifically, MR signals are acquired by a pre-scan, limited to an imaging region in which the MR signals are acquired with high intensities, under the same conditions as those for an imaging scan. Then, the reception gain for the imaging scan can be determined, based on the maximum value of the acquired MR signals, by the conventional formula (1).

Therefore, the reception gain acquisition part 40A has a function to set a reception gain for an imaging scan based on values of MR signals acquired by a pre-scan for setting the reception gain when a value of reception gain whose conditions agree has not been stored in the reception gain database 45. Note that, a value of reception gain set once by a pre-scan can be related to arbitrary conditions included in patient information and imaging conditions in the pre-scan and stored in the reception gain database 45.

Meanwhile, the imaging parameter setting part 40B in the imaging condition setting part 40 has a function to set imaging parameters, such as a pulse sequence, an imaging part of an object P, and the RF coils 24 to be used, according to direction information input from the input device 33. The imaging parameters, referred to as conditions for setting a reception gain, among the set imaging parameters are notified to the reception gain acquisition part 40A.

The patient information registration part 40C registers patient information, including a name, height, and weight of an object P which is a target for imaging, according to direction information input from the input device 33. Among the registered patient information, patient information referred to as conditions for setting imaging parameters is notified to the imaging parameter setting part 40B. Meanwhile, patient information, referred to as conditions for setting a reception gain, among the registered patient information is notified to the reception gain acquisition part 40A.

On the other hand, the data processing part 41 has a function to generate image data based on MR signals acquired by a scan, such as an imaging scan or a pre-scan. Specifically, the data processing part 41 has a function to obtain MR signals, which have been acquired by a scan under imaging conditions set in the imaging condition setting part 40, from the sequence controller 31 and arrange the obtained MR signals in a k-space formed in the k-space data storage part 42; a function to take k-space data from the k-space data storage part 42 and reconstruct image data by image reconstruction processing including an FT; a function to write image data obtained by the image reconstruction processing into the image data storage part 43; and a function to perform necessary image processing of image data taken from the image data storage part 43 and display the processed image data on the display unit 34.

The data processing part 41, having the above-mentioned functions, of the computer 32 functions as a generation part configured to receive MR signals of an object P with amplification with a reception gain obtained in the reception gain acquisition part 40A, and generate MR image data based on the received MR signals, by cooperating with hardware including the static field magnet 21, the shim coil 22, the gradient coil 23 and the RF coils 24. However, the generation part may be configured by other elements as long as similar functions are provided.

Next, an operation and action of the magnetic resonance imaging apparatus in the second embodiment will be described.

Figure 6:
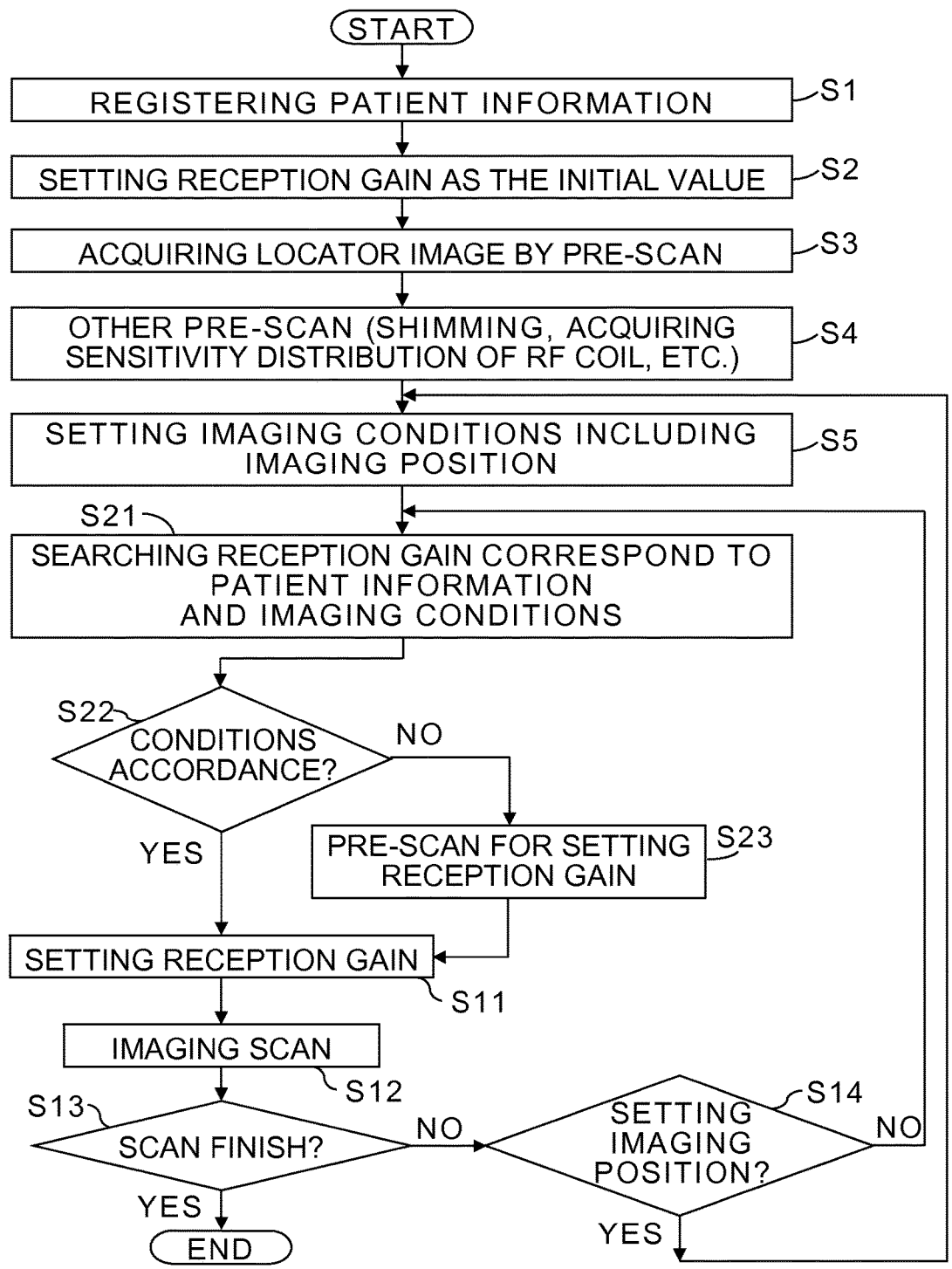
FIG. 6 is a flow chart which shows an example of operation of the magnetic resonance imaging apparatus in the second embodiment.

FIG. 6 is a flow chart which shows an example of operation of the magnetic resonance imaging apparatus in the second embodiment. Note that, same signs are attached with steps similar to those in the flow chart shown in FIG. 3, and detailed explanation of similar particulars is omitted.

At first, in Step S1 to Step S5, registration of patient information, setting a reception gain to its initial value, acquisition of locator image data by a pre-scan, other pre-scans, and setting of imaging conditions including imaging positions for an imaging scan are performed. In this case, patient information, referred to as conditions for setting a reception gain, among patient information of an object P, such as a name, height, and weight, registered by patient information registration part 40C in Step S1, is notified to the reception gain acquisition part 40A. Furthermore, in Step S5, imaging parameters, referred to as conditions for setting the reception gain, among imaging parameters, such as a pulse sequence for imaging, an imaging part of the object P, and the RF coils 24 to be used, set by the imaging parameter setting part 40B, are also notified to the reception gain acquisition part 40A.

Next, in Step S21, the reception gain acquisition part 40A searches the reception gain database 45, and judges whether a reception gain corresponding to patient information and imaging parameters which agree with the patient information notified from the patient information registration part 40C and the imaging parameters notified from the imaging parameter setting part 40B respectively has been stored or not.

Then, in Step S22, when it is judged that conditions agreeing with the conditions consisting of the patient information and the imaging parameters have not been stored in the reception gain database 45, a pre-scan for determining a reception gain is performed in Step S23. That is, the initial value of reception gain is set to zero or a sufficiently small value, and MR signal are acquired, from an imaging region where MR signal are acquired with high intensities, under the same conditions as those for the imaging scan.

Next, in Step S11, the reception gain acquisition part 40A sets the reception gain for the imaging scan, based on the maximum value of the MR signals acquired by the pre-scan, by the conventional formula (1).

Meanwhile, when it is judged in Step S22 that the conditions agreeing with the conditions consisting of the patient information and the imaging parameters have been stored in the reception gain database 45, the reception gain acquisition part 40A acquires a reception gain, related to the agreeing conditions, from the reception gain database 45, and sets it to the reception gain for the imaging scan, in Step S11.

Next, in Step S12, the imaging scan is performed with amplification of MR signals using the reception gain set by the reception gain acquisition part 40A. Thereby, the MR signals amplified by the appropriate reception gain in the amplifier 30A of the receiver 30 are arranged in a k-space formed in the k-space data storage part 42.

Subsequently, the data processing part 41 generates diagnostic image data for display by image reconstruction processing and required image processing of the MR signals acquired by the imaging scan. The generated diagnostic image data are displayed on the display unit 34. Since the diagnostic image data displayed on the display unit 34 have been generated based on the MR signals amplified by the appropriate reception gain, the diagnostic image data can be displayed with an improved SNR.

Next, in Step S13, it is judged whether all required imaging scans have been completed or not. When the next imaging scan is performed, it is judged whether imaging positions are newly set or not in Step S14. When imaging positions are newly set, imaging conditions including the imaging positions are newly set in Step S5. Then, a reception gain, which corresponds to the imaging conditions including the newly set imaging positions, is searched for in Step S21. Meanwhile, when imaging positions are not newly set, a reception gain, which corresponds to imaging conditions of the next imaging scan for the same imaging positions, is searched for in Step S21. Then, setting a reception gain and an imaging scan are repeated until it is judged in Step S13 that all imaging scans have been completed.

Note that, reception gains for a pre-scan for acquiring locator image data and pre-scans for other purposes can be also related to at least one of patient information and data acquisition conditions, and previously stored in the reception gain database 45, as well as reception gains for imaging scans. In that case, a pre-scan can be performed using a reception gain, corresponding to patient information and data acquisition conditions, stored in the reception gain database 45.

That is, reception gains according to patient information and data acquisition conditions can be stored in the reception gain database 45, and an appropriate reception gain can be read out and set for a scan, regardless of an imaging scan or a pre-scan.

The above mentioned magnetic resonance imaging apparatus in the second embodiment is to previously define appropriate reception gains of MR signals for pieces of reference data, such as patient information and/or imaging conditions, and to determine an appropriate reception gain for imaging easily in a short time according to parameters, such as patient information and/or imaging conditions, each varying depending on imaging and influencing an appropriate value of the reception gain.

Therefore, according to the magnetic resonance imaging apparatus in the second embodiment, a pre-scan, conventionally performed before imaging, for determining a reception gain of MR signals, can be omitted. As a result, a time taken for setting a reception gain can be shortened and a throughput in examination can be improved.

Moreover, a precision required for a set value of reception gain tends to be lowered by the progress of hardware in recent years. Therefore, even when a reception gain is determined by a method for selecting an appropriate value of reception gain from multiple values of reception gains stored in a database, the reception gain can be set with a sufficient accuracy. Therefore, MR images can be acquired with an improved SNR by receiving MR signals with an appropriate reception gain.

Third Embodiment

In the magnetic resonance imaging apparatus in the third embodiment, the functions of the computer 32 are different from those of each of the magnetic resonance imaging apparatus 20 in the first embodiment and the magnetic resonance imaging apparatus in the second embodiment. The other configurations and actions of the magnetic resonance imaging apparatus in the third embodiment do not differ from those of each of the magnetic resonance imaging apparatus 20 in the first embodiment and the magnetic resonance imaging apparatus in the second embodiment substantially. Therefore, only a functional block diagram of the receiver 30 and the computer 32 is illustrated, and same signs are attached with same elements and corresponding elements and detailed explanation thereof is omitted.

Figure 7:
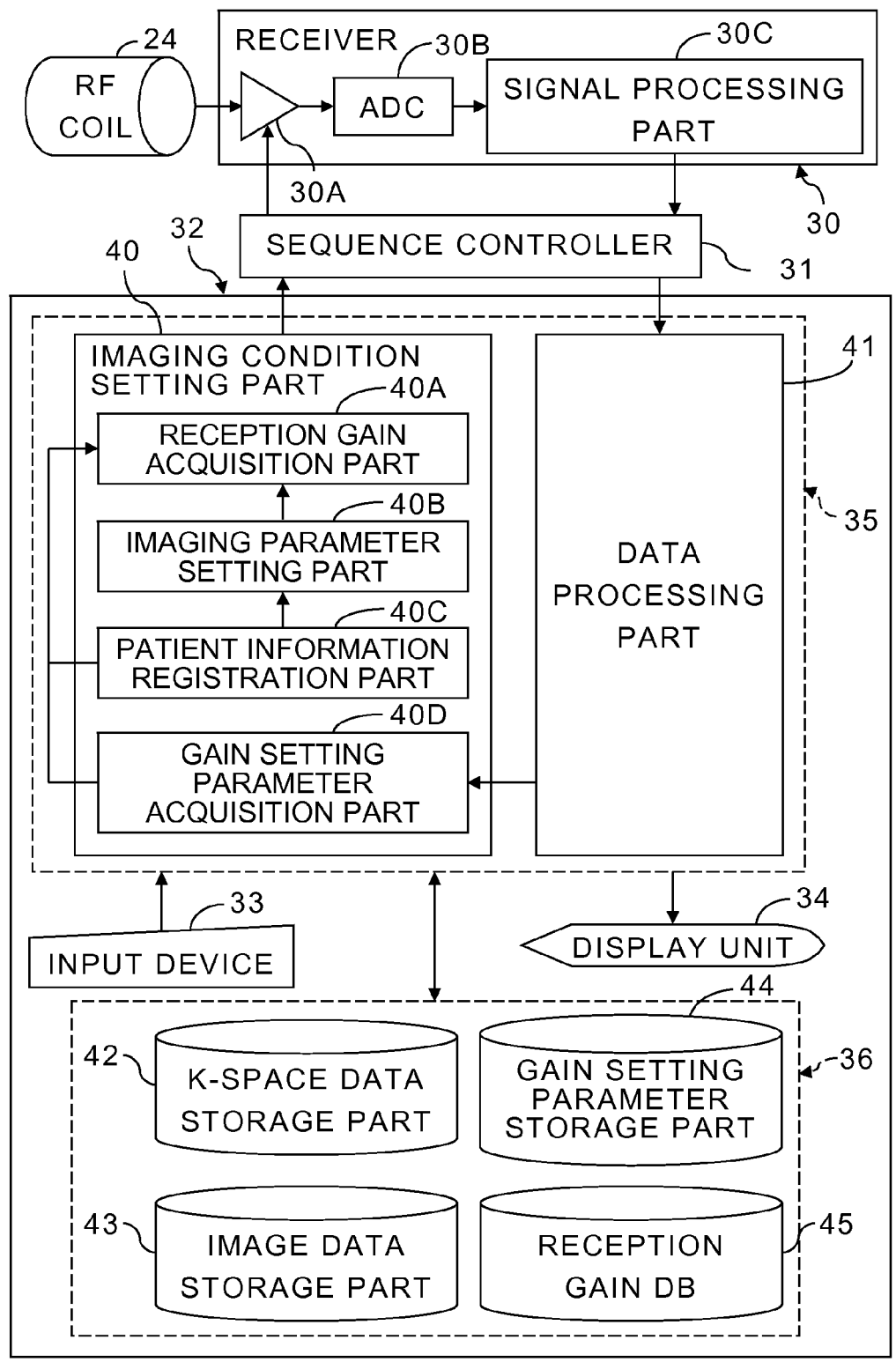
FIG. 7 is a functional block diagram of the receiver and the computer included in the magnetic resonance imaging apparatus according to the third embodiment of the present invention.

FIG. 7 is a functional block diagram of the receiver 30 and the computer 32 included in the magnetic resonance imaging apparatus according to the third embodiment of the present invention.

The imaging condition setting part 40 in the third embodiment has the reception gain acquisition part 40A, the imaging parameter setting part 40B, the patient information registration part 40C, and the gain setting parameter acquisition part 40D. Moreover, the storage unit 36 functions as the k-space data storage part 42, the image data storage part 43, the gain setting parameter storage part 44, and the reception gain database 45. That is, the magnetic resonance imaging apparatus in the third embodiment has the functions of both the magnetic resonance imaging apparatus 20 in the first embodiment and the magnetic resonance imaging apparatus in the second embodiment.

Especially, the reception gain acquisition part 40A is configured to set a reception gain for receiving MR signals based on imaging conditions and reference data corresponding to an imaging region when a reception gain of MR signals corresponding to at least one of patient information and the imaging conditions has not been stored in the reception gain database 45. Therefore, the reference data referred to for setting a reception gain are acquired by a pre-scan in prior to acquisition of MR signals, for generating diagnostic image data, acquired from an imaging region, as described in the first embodiment.

Figure 8:
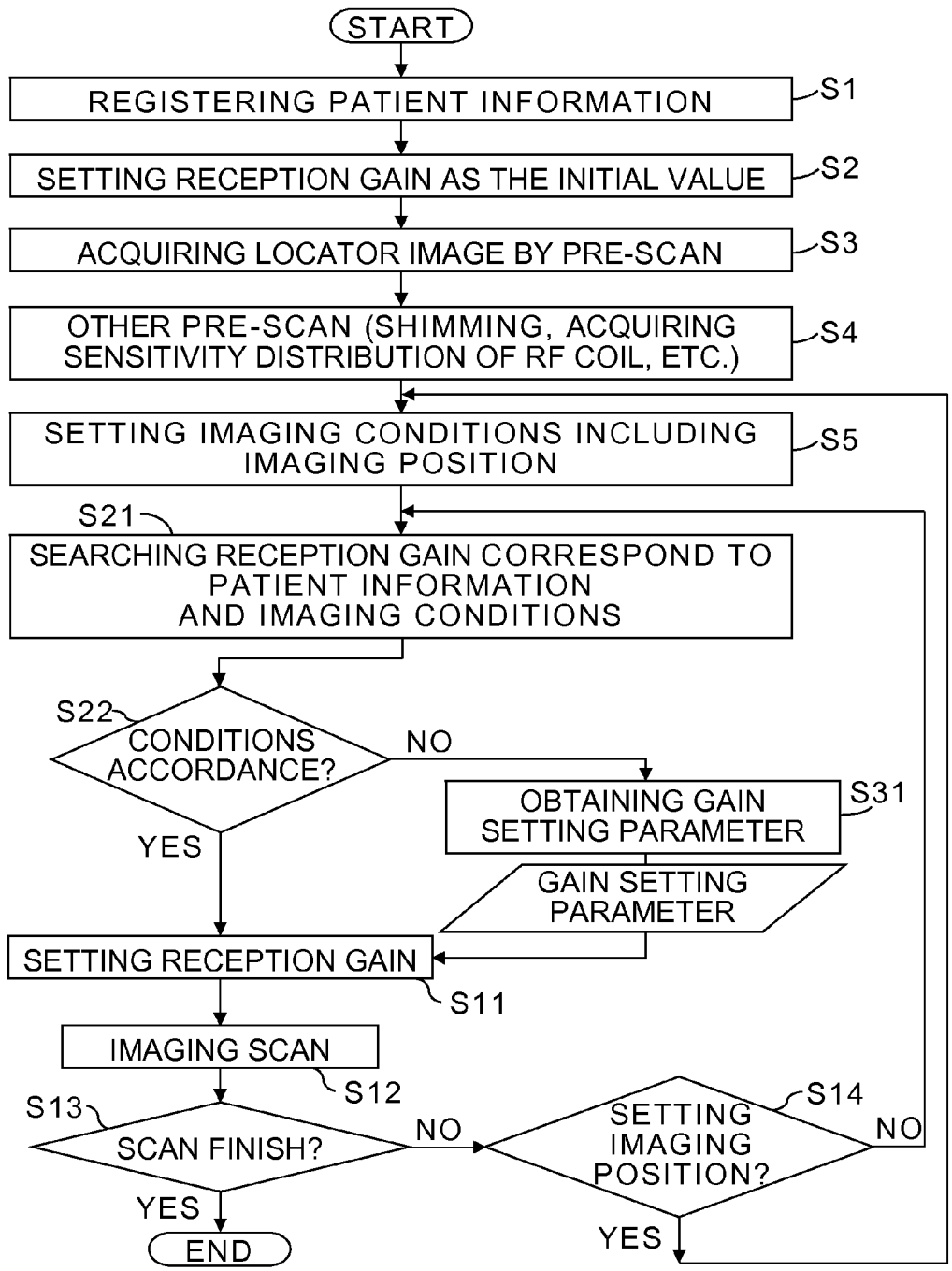
FIG. 8 is a flow chart which shows an example of operation of the magnetic resonance imaging apparatus in the third embodiment.
Figure 9:
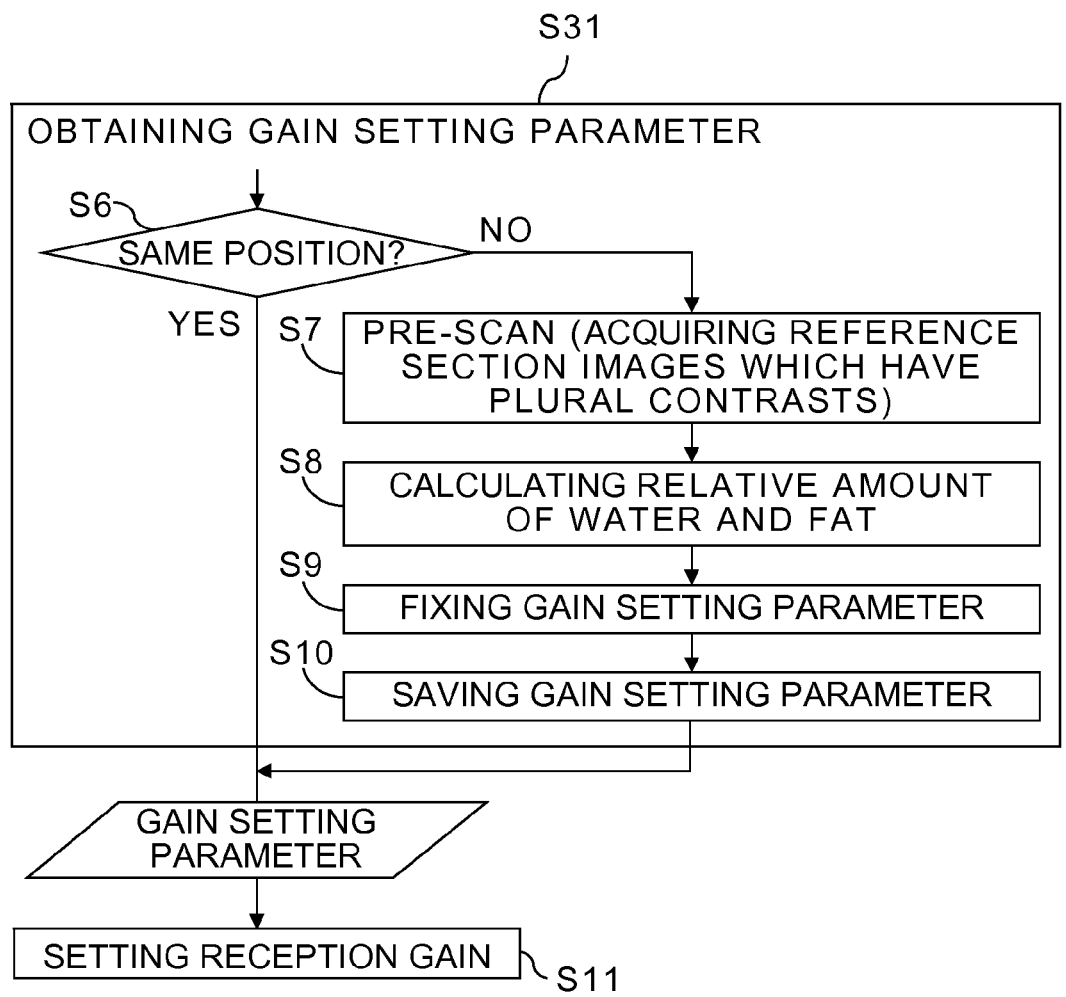
FIG. 9 is a flow chart which shows a detailed flow of the operation and processing in Step S31 of the flow chart shown in FIG. 8.

FIG. 8 is a flow chart which shows an example of operation of the magnetic resonance imaging apparatus in the third embodiment. FIG. 9 is a flow chart which shows a detailed flow of the operation and processing in Step S31 of the flow chart shown in FIG. 8. Note that, same signs are attached with steps similar to those in the respective flow charts shown in FIG. 3 and FIG. 6, and detailed explanation of similar particulars is omitted.

At first, in Step S1 to Step S5, registration of patient information, setting a reception gain to its initial value, acquisition of locator image data by a pre-scan, other pre-scans, and setting imaging conditions including imaging positions for an imaging scan are performed. Next, the reception gain acquisition part 40A searches the reception gain database 45 in Step S21, and it is judged whether a reception gain corresponding to the patient information and the imaging parameters has been stored or not in the reception gain database 45 in Step S22.

When the reception gain corresponding to the patient information and the imaging parameters has been stored in the reception gain database 45, setting the reception gain in Step S11, the imaging scan in Step S12, the respective judgments in Step S13 and Step S14 after the imaging scan are performed sequentially in a flow similar to the flow in the second embodiment shown in FIG. 6.

Meanwhile, when the reception gain corresponding to the patient information and the imaging parameters has not been stored in the reception gain database 45, setting parameters of the reception gain are obtained in Step S31. As shown in FIG. 9, obtaining the setting parameters of the reception gain can be performed by operations and processing similar to the operations and the processing in Step S6 to Step S10 of FIG. 3.

That is, in a case of the first imaging scan or in a case that imaging positions have changed, the setting parameters of the reception gain can be obtained by the operations and the processing including a pre-scan in Step S7 to Step S10. For example, a distribution of fat signals can be obtained based on reference data acquired by the pre-scan, and the setting parameters of the reception gain can be obtained based on the distribution of the fat signals.

Meanwhile, when the imaging positions have not changed, the setting parameters corresponding to the imaging positions can be acquired from the gain setting parameter storage part 44, without a pre-scan. Then, in Step S11, an appropriate reception gain for the imaging conditions can be set based on the imaging parameters and the setting parameters corresponding to the imaging positions.

The magnetic resonance imaging apparatus in the third embodiment mentioned above is to store appropriate reception gains, for different pieces of patient information and imaging conditions, in the reception gain database 45, and to calculate a reception gain using parameters based on reference data acquired by a pre-scan when a corresponding reception gain has not been stored in the reception gain database 45.

Therefore, according to the third embodiment, both the effects attained in the first embodiment and the effects attained in the second embodiment can be attained. That is, the number of pre-scans for setting an appropriate reception gain of MR signals according to imaging conditions can be reduced further. Specifically, a pre-scan only for setting a reception gain can be omitted except the case that a corresponding reception gain has not been stored in the reception gain database 45 and the case that corresponding setting parameters of reception gain have not been stored in the gain setting parameter storage part 44.

Other Embodiments

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
   a reception gain storage configured to store reception gains to be used for received magnetic resonance signals, the reception gains being related to at least one of patient information and imaging conditions;
   at least one computer configured to obtain a reception gain from said reception gain storage, based on at least one of patient information and an imaging condition for a patient to be imaged, the patient information and the imaging condition having been specified for an imaging scan of the patient; and at least one MRI system sequence control computer configured to receive radio frequency (RF) magnetic resonance signals from the patient using the obtained reception gain and generate image data based on the amplified received magnetic resonance signals.

2. The magnetic resonance imaging apparatus of claim 1, wherein:
said reception gain storage is configured to store the reception gains as being related to directly or indirectly expressed ratios of fat signal amounts included in received magnetic resonance signals; and
said at least one computer is configured to obtain a corresponding reception gain from said reception gain storage, based on information expressing a ratio of a fat signal amount specified for the imaging.

3. The magnetic resonance imaging apparatus of claim 2, wherein:
said reception gain storage is configured to store reception gains as being related to ratios of fat signal amounts, including at least one of patient weights, water excitation conditions, application conditions of at least one inversion recovery pulse, conditions of shimming, application conditions of at least one fat saturation pulse, and body-mass indexes expressing degrees in obesity of patients.

4. The magnetic resonance imaging apparatus of claim 1, wherein:
said reception gain storage is configured to store reception gains as being related to imaging conditions including at least one of imaging sequences, parts of patients to be imaged, and radio frequency coils to be used.

5. The magnetic resonance imaging apparatus of claim 1, wherein:
said at least one computer is configured to set a reception gain for receiving the RF magnetic resonance signals, based on a specified imaging condition and reference data obtained prior to acquisition of the magnetic resonance signals to be used for generating the image data when reception gain corresponding to the specified patient information or imaging condition has not been previously stored in said reception gain storage part, the reference data corresponding to a specified imaging area.

6. The magnetic resonance imaging apparatus of claim 5, wherein:
said at least one computer is configured to obtain a distribution of fat signals based on the reference data and set reception gain for imaging based on the obtained distribution of the fat signals when reception gain corresponding to specified patient information or imaging condition has not been previously stored in said reception gain storage.

7. The magnetic resonance imaging apparatus of claim 5, wherein:
said at least one computer is configured to obtain a factor characteristic to the patient, as a parameter at each of plural spatial positions, based on the reference data, and to set reception gain for imaging based on the parameter expressing (a) the factor at the each spatial position and (b) an imaging parameter included in the specified imaging condition, when reception gain corresponding to patient information or imaging condition has not been previously stored in said reception gain storage, the factor influencing intensities of the received magnetic resonance signals.

8. The magnetic resonance imaging apparatus of claim 5, wherein:
said at least one computer is configured to set a new reception gain for receiving new RF magnetic resonance signals based on the reference data and a new imaging condition when the new imaging conditions have been set including imaging positions which are considered to be same as or a part of imaging positions set as a specified imaging condition.

9. The magnetic resonance imaging apparatus of claim 7, wherein:
said at least one computer is configured to obtain at least an image signal value of reference image data at the each of plural spatial positions or a value corresponding to the image signal value, as the parameter expressing the factor at the each spatial position.

10. The magnetic resonance imaging apparatus of claim 7, wherein:
said at least one computer is configured to obtain a relative amount of water and fat at each spatial position, as the parameter expressing the factor at the each spatial position.

11. The magnetic resonance imaging apparatus of claim 10, wherein
said at least one computer is configured to obtain the relative amount of water and fat based on reference image data sets having different contrasts, the reference image data sets having been obtained as the reference data.

12. The magnetic resonance imaging apparatus of claim 5, wherein said at least one computer is configured to set reception gain, for imaging, using a coefficient corresponding to a radio frequency coil to be used for acquiring the magnetic resonance signals from the imaging area when reception gain corresponding to the specified piece of the patient information or the specified imaging condition has not been previously stored in said reception gain storage.

13. The magnetic resonance imaging apparatus of claim 7, wherein:
said at least one computer is configured to calculate reception gain for the imaging by an operation using at least one physical property value of proton density, longitudinal relaxation time and transverse relaxation time, at the each spatial position according to a relative amount of water and fat, and at least one imaging parameter of a repetition time, an echo time and an inversion time in an inversion recovery method, when reception gain corresponding to the specified patient information or the specified imaging condition has not been previously stored in said reception gain storage part.

14. The magnetic resonance imaging apparatus of claim 5, wherein:
said at least one MRI system sequence control computer is configured to acquire magnetic resonance signals for generating the reference data by a pre-scan preceding acquisition of magnetic resonance signals be used to generate the image data when reception gain corresponding to the specified patient information or the specified imaging condition has not been previously stored in said reception gain storage.

15. The magnetic resonance imaging apparatus of claim 14, wherein:

said at least one MRI system sequence control computer is configured to acquire magnetic resonance signals for generating the reference data by a pre-scan for acquiring locator image data, the pre-scan preceding the acquisition of magnetic resonance signals to be used to generate for generating the image data.

16. A magnetic resonance imaging (MRI) method comprising:

storing data representing reception gains of magnetic resonance signals, the reception gains being related in storage to at least one of patient information and imaging conditions;

retrieving reception gain data from said stored data based on patient information or imaging condition specified for an imaging scan of the patient; and receiving radio frequency (RF) magnetic resonance signals from the patient and amplifying said received signals with an amplification factor corresponding to the relieved reception gain and generating image data based on the received and amplified magnetic resonance signals.

* * * * *